(12) United States Patent
Leete

(10) Patent No.: US 7,170,326 B2
(45) Date of Patent: Jan. 30, 2007

(54) PULSE-ON-EDGE CIRCUIT

(75) Inventor: John Cumming Leete, Huntington Beach, CA (US)

(73) Assignee: Broadcom Corporation, Irvine, CA (US)

( * ) Notice: Subject to any disclaimer, the term of this patent is extended or adjusted under 35 U.S.C. 154(b) by 50 days.

(21) Appl. No.: 11/095,238

(22) Filed: Mar. 30, 2005

(65) Prior Publication Data

US 2006/0145742 A1 Jul. 6, 2006

Related U.S. Application Data

(60) Provisional application No. 60/642,231, filed on Jan. 6, 2005.

(51) Int. Cl.
*H03K 7/08* (2006.01)

(52) U.S. Cl. ..................... 327/172; 327/291

(58) Field of Classification Search ........ 327/172–176, 327/178, 291, 292, 551, 552, 553
See application file for complete search history.

(56) References Cited

U.S. PATENT DOCUMENTS

| | | | | |
|---|---|---|---|---|
| 6,060,931 A | * | 5/2000 | Stahl | 327/291 |
| 6,320,437 B1 | * | 11/2001 | Ma | 327/175 |

* cited by examiner

*Primary Examiner*—Linh My Nguyen
(74) *Attorney, Agent, or Firm*—McAndrews, Held & Malloy, Ltd.

(57) ABSTRACT

A pulse on edge circuit includes a first pull up transistor having its gate terminal coupled to a delayed control signal and a second pull up transistor having its gate terminal coupled to an inverted delayed control signal. A first and second pull down transistors are coupled in series between the first pull up transistor and a low voltage bias, wherein the gates of the first and second pull down transistors are coupled to the delayed control signal and inverted control signal, respectively. A third and fourth pull down transistors are coupled in series between the second pull up transistor and the low voltage bias. The gates of the third and fourth pull down transistors are coupled to a control signal and the inverted delayed control signal, respectively.

4 Claims, 8 Drawing Sheets

Slower edges caused by RC time constant are negligible

PD_fast
$\overline{\text{PD\_fast}}$
PD_slow
$\overline{\text{PD\_slow}}$

PULSE-ON-EDGE CIRCUIT

CROSS-REFERENCE TO RELATED APPLICATION

This Patent Application claims the benefit of the filing date of U.S. Provisional Patent Application Ser. No. 60/642,231, filed on Jan. 6, 2005 and entitled "PULSE-ON-EDGE CIRCUIT," the entire content of which is hereby expressly incorporated by reference.

FIELD OF THE INVENTION

The present invention relates generally to electronic circuits; and more particularly to pulse-on-edge circuit.

BACKGROUND OF THE INVENTION

In electronic circuits, situations arise that require a signal with a temporary (short period) change in its state (level), however, the available control signals in the circuit have a large period relative to the short duration of the desired state change. Therefore, a relatively short pulse signal needs to be generated from the control signal having a large period.

SUMMARY OF THE INVENTION

In one aspect, the invention is a negative pulse on edge circuit including a first pull up transistor having its gate terminal coupled to a delayed control signal; a second pull up transistor having its gate terminal coupled to an inverted delayed control signal, wherein the first and second pull up transistors are coupled together at a first terminal and coupled to a power source at a second terminal; a first and second pull down transistors coupled in series between the first pull up transistor and a low voltage bias, wherein the gate of the first pull down transistor is coupled to the delayed control signal and the gate of the second pull down transistor is coupled to an inverted control signal; and a third and fourth pull down transistors coupled in series between the second pull up transistor and the low voltage bias, wherein the gate of the third pull down transistor is coupled to a control signal and the gate of the fourth pull down transistor is coupled to the inverted delayed control signal and wherein an output pulse signal is generated from the coupled first terminals of the first and second pull up transistors.

In one aspect, the invention is a positive pulse on edge circuit including a first pull down transistor having its gate terminal coupled to a delayed control signal; a second pull down transistor having its gate terminal coupled to an inverted delayed control signal, wherein the first and second pull down transistors are coupled together at a first terminal and coupled to a low voltage bias at a second terminal; a first and second pull up transistors coupled in series between the first pull down transistor and a power supply, wherein the gate of the first pull up transistor is coupled to an inverted control signal and the gate of the second pull up transistor is coupled to the delayed control signal; and a third and fourth pull up transistors coupled in series between the second pull down transistor and the power supply, wherein the gate of the third pull up transistor is coupled to a the inverted delayed control signal and the gate of the fourth pull up transistor is coupled to a control signal and wherein an output pulse signal is generated from the coupled first terminals of the first and second pull down transistors.

In one aspect, the invention is a method for bypassing a filter. The method includes generating an inverted control signal, a delayed control signal and an inverted delayed control signal from a control signal; generating a pulse signal from the control signal, the inverted control signal, the delayed control signal and the inverted delayed control signal; and controlling a switch across the filter by the generated pulse signal to bypass the filter.

BRIEF DESCRIPTION OF THE DRAWINGS

The objects, advantages and features of this invention will become more apparent from a consideration of the following detailed description and the drawings, in which.

DETAILED DESCRIPTION

In one embodiment, the present invention is a circuit that takes a single phase clock or control signal as its input and generates a negative pulse on each positive and negative edge of the input signal. In one embodiment, the circuit generates a positive pulse on each edge.

The circuit according to the invention may be used to generate a pulse that controls a shorting switch to quickly discharge and charge a capacitor, for example, the capacitor of a bias filter. In this case, the invention allows the bias circuit to start up and shut down quickly, while allowing the filter to remain intact during normal operation. In one embodiment, the pulse-on-edge circuit may be triggered by a power-down/power-up signal.

Although, the invention is described in relation to a bias filter, it will be appreciated by those skilled in the art that the pulse-on-edge circuit is likewise suitable for various other electronic circuit applications. Accordingly, the described exemplary embodiment of the pulse-on-edge circuit in a bias filter is by way of example only and not by way of limitation.

Figures 1A, 1B:
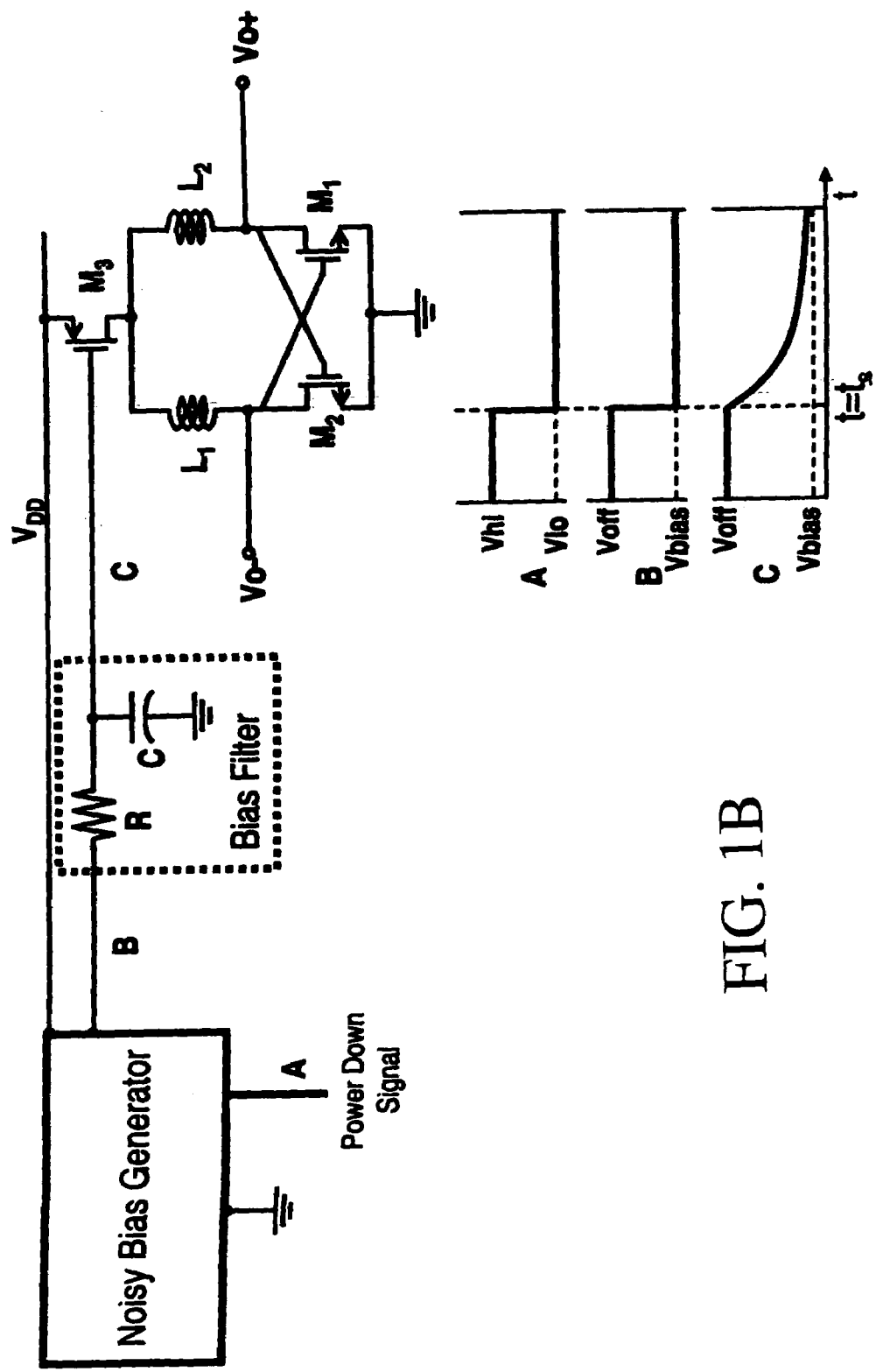
FIGS. 1A and 1B are an exemplary oscillator biased by a bias generator and a corresponding timing diagram, respectively.

FIG. 1A shows an exemplary amplifier being biased by a bias generator. The bias generator is controlled by a power down signal A that turns the bias generator off to save power in the power down mode. An RC filter is used to limit the noise on the bias voltage to provide a cleaner signal C for the amplifier. However, when the noise filter is used on the bias line, in general, it affects the amount of time it takes for the circuit to power up and power down, that is, for the bias voltage to reach its full value at the power up mode and reach its low value at the power down. Moreover, if it is necessary to filter the noise down to relatively low frequencies, the filter needs to have a low corner frequency. The lower the corner frequency of the filter, the longer it takes to power up and power down the bias voltage. Nevertheless, it is often desirable for the bias voltage to settle quickly to it's final state.

FIG. 1B illustrates an exemplary timing diagram for the circuit of FIG. 1A. As shown in the timing diagram of FIG. 1B, Power Down signal (PD) at node A transitions from high to low state at time t=ts allowing the circuits to power up. Node B then quickly transitions from Voff to a desired bias voltage Vbias. However, transition from Voff to Vbias at C occurs slowly as it takes a while to discharge/charge capacitor C through R.

Figures 2A, 2B:
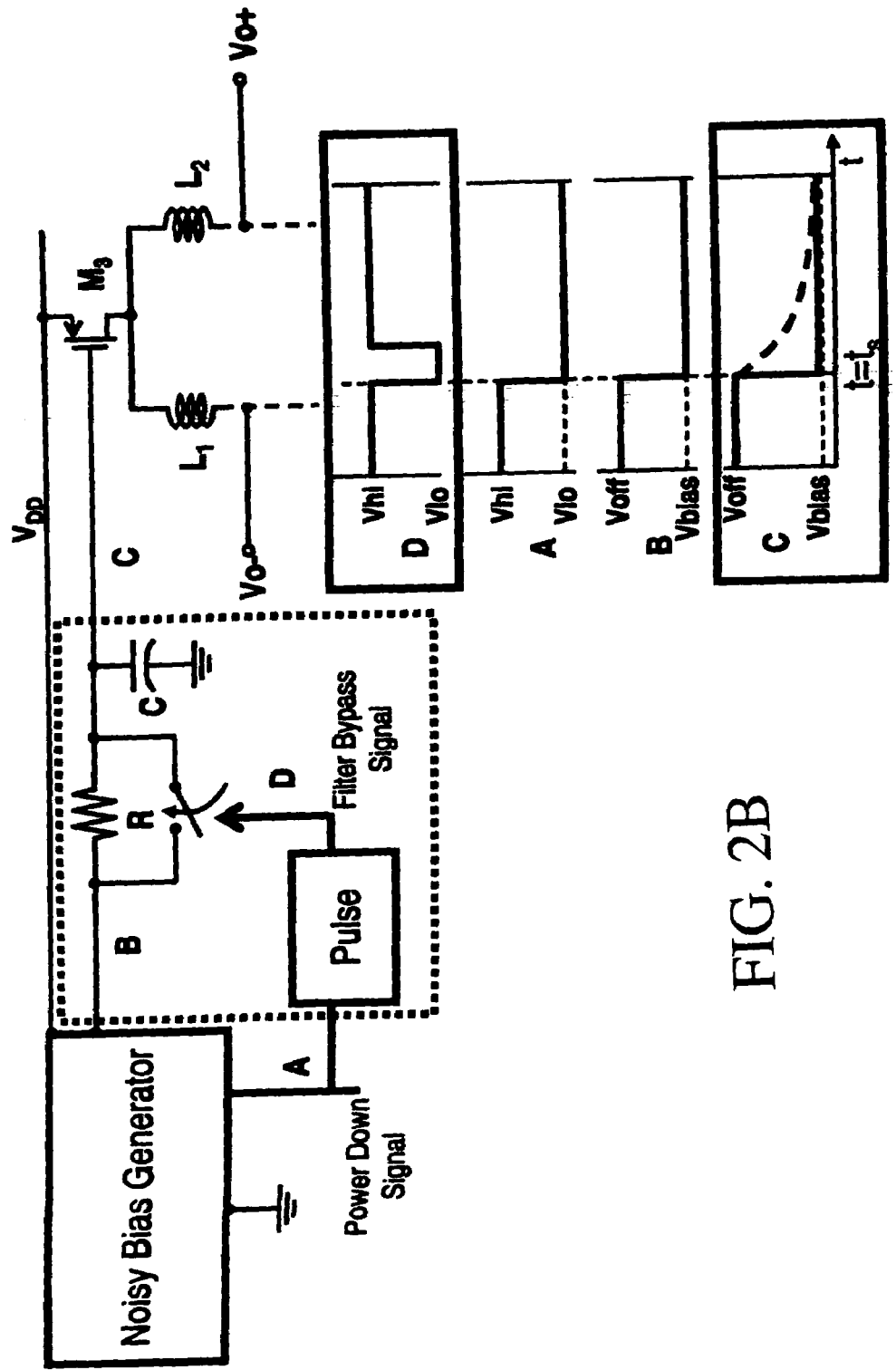
FIGS. 2A and 2B are an exemplary pulse generator circuit that takes the power down signal as its input and generates a filter bypass pulse signal and a corresponding timing diagram, respectively.

FIG. 2A shows a pulse generator circuit that takes the power down signal as its input and generates a filter bypass pulse signal, according to one embodiment of the present invention. FIG. 2B illustrates an exemplary timing diagram for the circuit of FIG. 2A. As shown in the timing diagram of FIG. 2B, PD signal at node A transitions from high to low state at time t=ts allowing circuits to power up. Node B then quickly transitions from Voff to desired bias voltage Vbias. Filter Bypass pulse signal at D generated by the pulse generator circuit from A momentarily bypasses R allowing node C to charge/discharge rapidly.

Figures 3A, 3B:
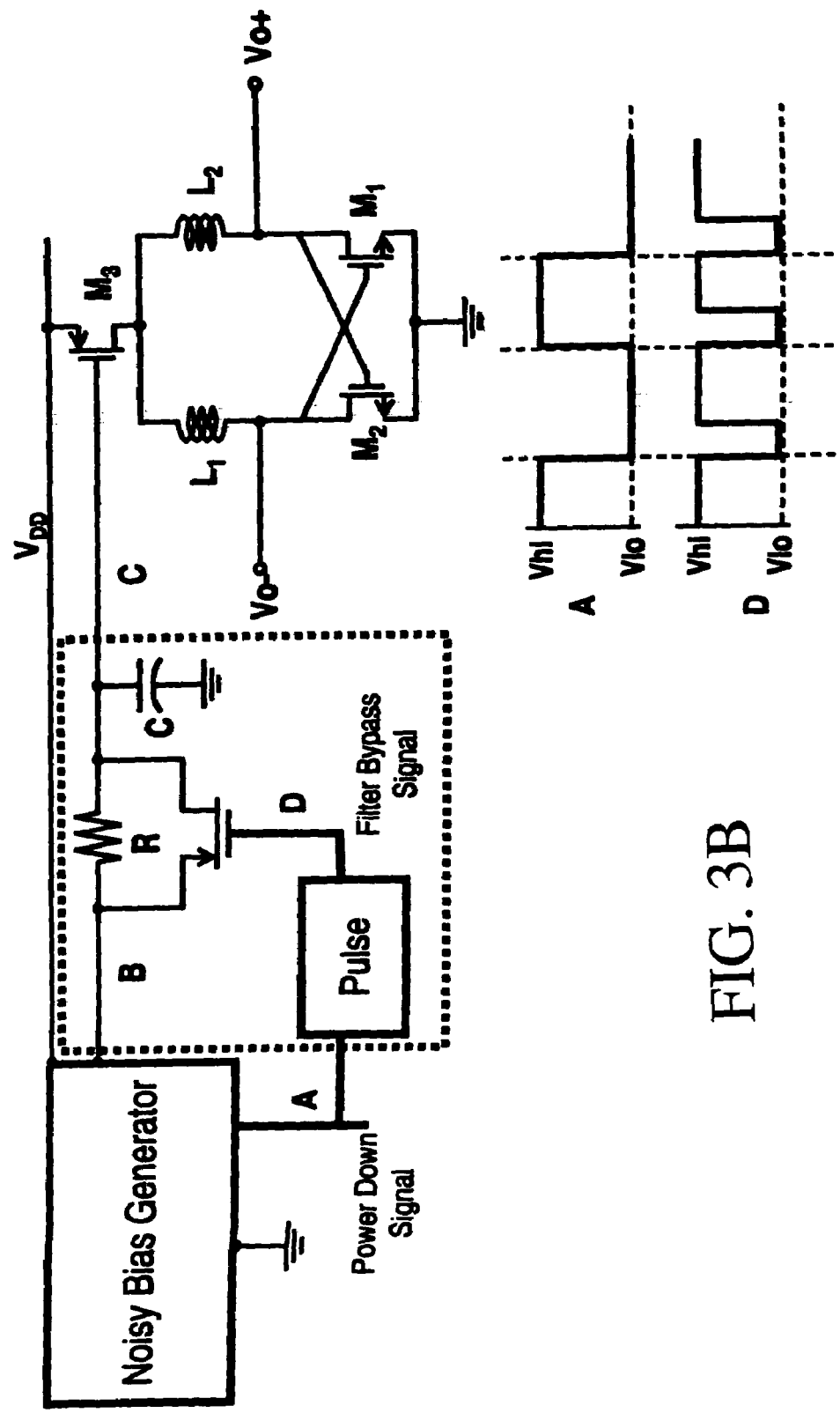
FIGS. 3A and 3B are an exemplary pulse generator circuit that includes a PMOS transistor that operates as a switch and a corresponding timing diagram, respectively.

FIG. 3A shows an exemplary pulse generator circuit that includes a PMOS transistor M3 that operates as a switch. Additionally, the oscillator is shown as a differential oscillator formed by cross-connected NMOS transistors M1 and M2. FIG. 3B illustrates an exemplary timing diagram for the circuit of FIG. 3A. As shown in the timing diagram of FIG. 3B, the filter bypass signal D is generated on rising and falling edges of Power down signal A, that is, a down pulse on each transition of A. This ensures the amplifier will power up and power down quickly. In this exemplary case, a PMOS transistor that requires a low voltage to turn on is used as the bypass switch.

Figures 4A, 4B:
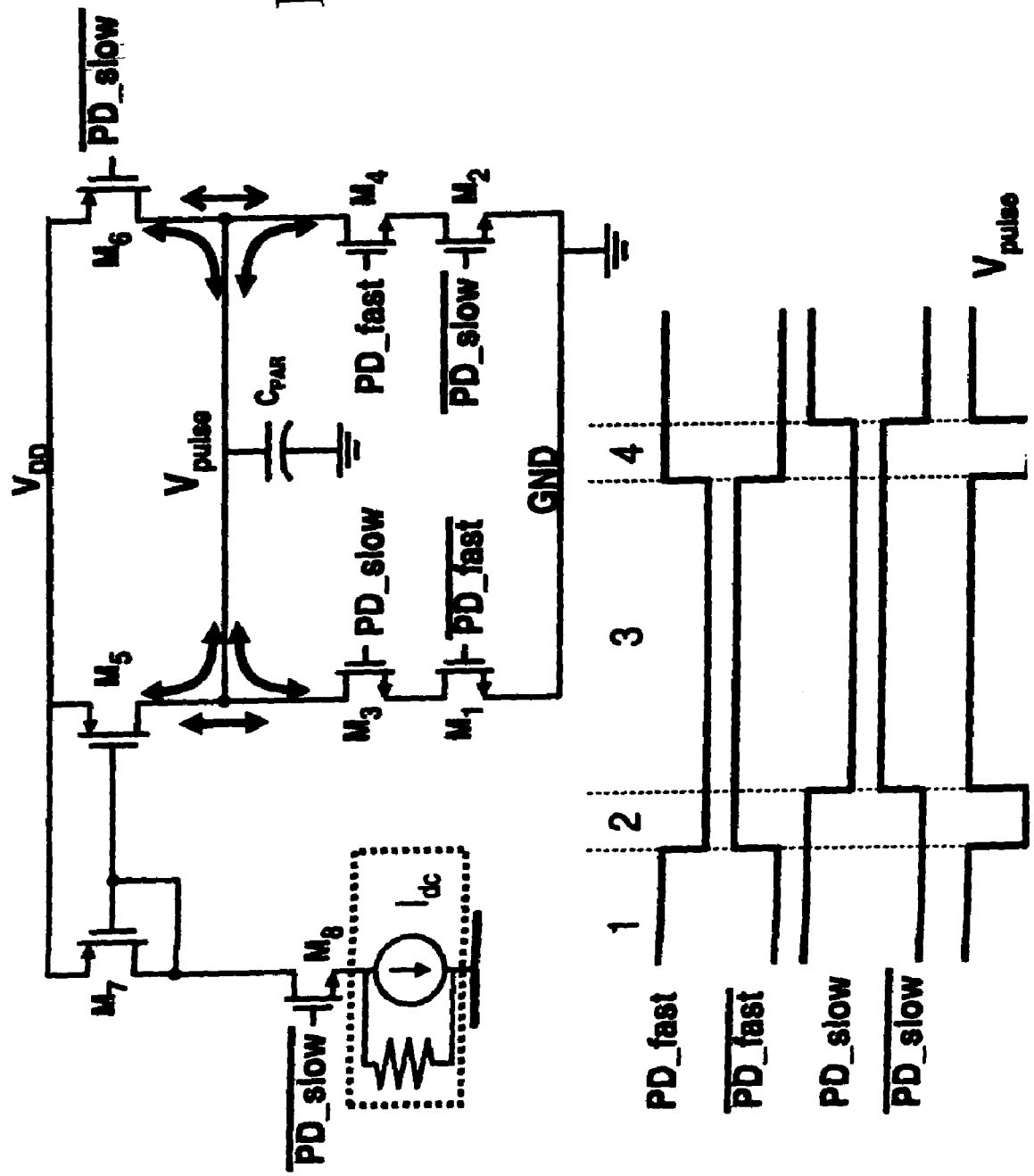
FIG. 4A is an exemplary negative pulse-on-edge circuit, according to one embodiment of the present invention
FIG. 4B depicts a corresponding timing diagram.

FIG. 4A is an exemplary negative pulse-on-edge circuit, according to one embodiment of the present invention and FIG. 4B depicts a corresponding timing diagram. The PMOS transistors M5 and M6 are driven by PD_slow and NPD_slow (complement of PD_slow) signals, respectively to pull the node Vpulse having a capacitor Cpar coupled thereto. Signals PD_fast, NPD_fast, PD_slow, and NPD_slow drive NMOS transistors M4, M1, M3, and M2, respectively. In one embodiment, PD_slow signal driving the gate of M5 may be generated from NPD_slow using an inverter. In one embodiment, the inverter is formed by PMOS transistor M7 and NMOS transistor M8, along with a current source Idc.

Figure 5B:
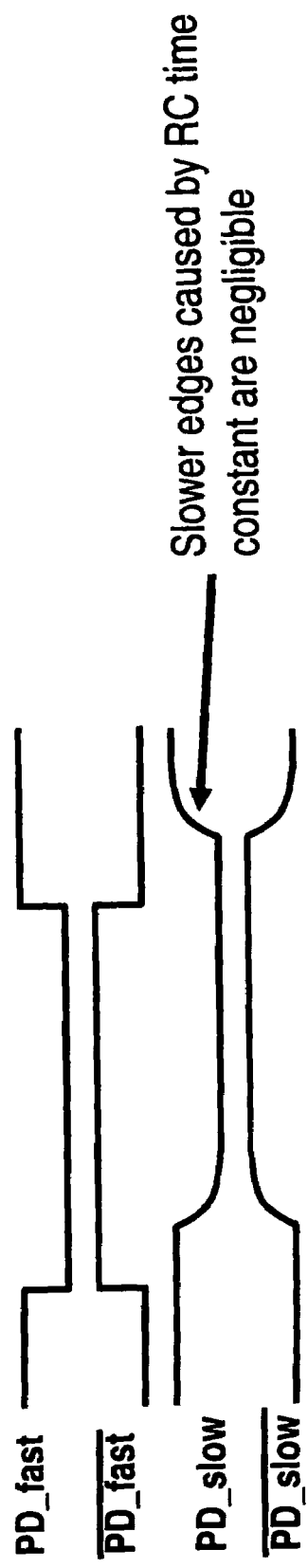
FIGS. 5A and 5B are an exemplary timing delay circuit and a corresponding timing diagram, respectively.
Figure 5A:
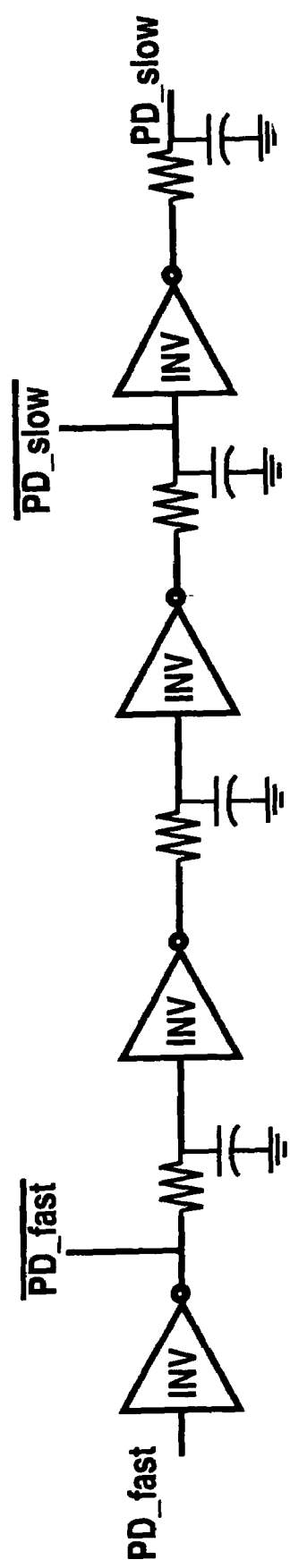

In one embodiment, signals NPD_fast, PD_slow, and NPD_slow are generated from PD_fast (power up) signal by a couple of inverters and one or more delay elements, for example RC delays, as shown in FIG. 5A. FIG. 5B illustrates a corresponding timing diagram of the inverter-delay of FIG. 5A.

Figure 6B:
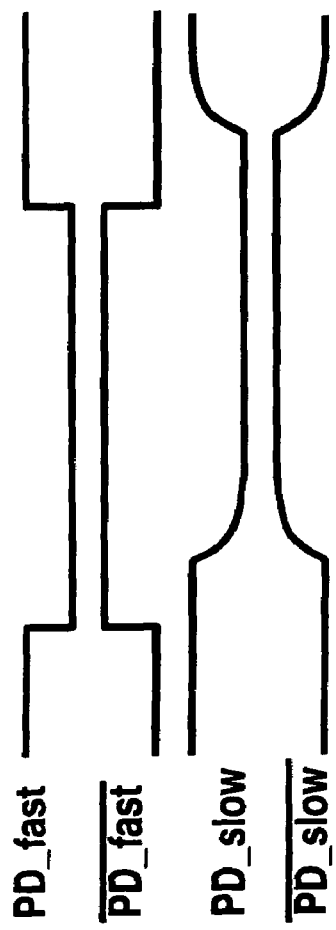
FIGS. 6A and 6B are an exemplary timing delay circuit and a corresponding timing diagram, respectively.
Figure 6A:
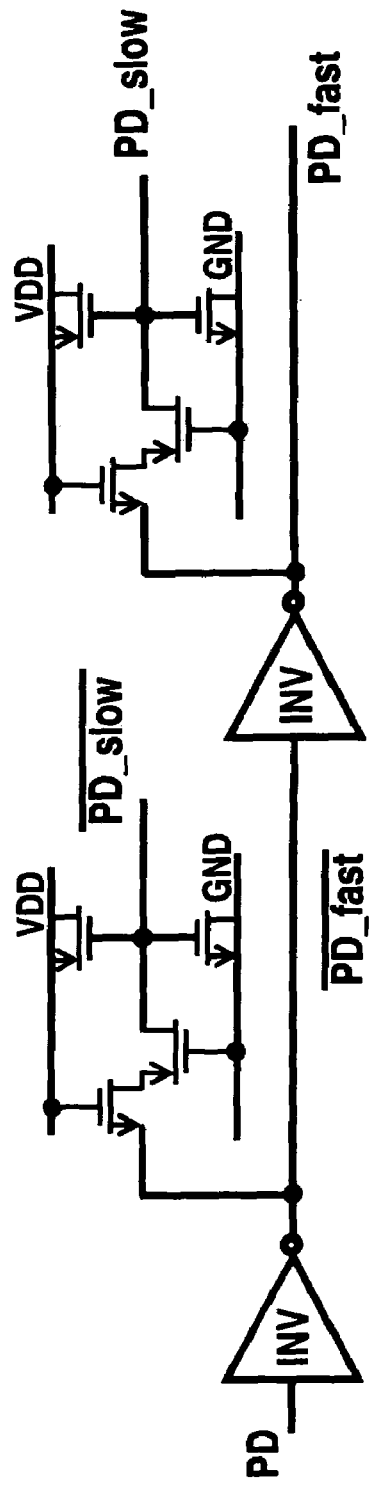

FIG. 6A shows one exemplary implementation of the RC delay elements, according to one embodiment of the present invention and FIG. 6B depicts a corresponding timing diagram. In one embodiment, NMOS and PMOS transistors Mr1 and Mr2 with narrow width and long channel are used for resistance. Similarly, NMOS and PMOS transistors Mc1 and Mc2 with wide width and long channel length are used for Capacitance.

Referring back to FIGS. 4A and 4B, the operation of the negative pulse-on-edge circuit is divided into four timing regions. In region 1, NPD_slow is low turning the PMOS transistor M8 off and preventing Idc from passing through M7, M5 which are also off. M3, M4 are on, but M1, M2 are off. M6 is also on, pulling Vpulse to VDD. In region 2, where PD_slow is high, M3 is turned on, M1 also turns on overcoming M6 and pulling Vpulse to GND, because M1 and M3 are larger than M6. M4 turns off, because PD_fast is low.

In region 3, NPD_slow turns M2 on, but M4 is already off because PD_fast is low. M3 and M6 are also turned off, while M8 turns on, allowing current to reflect through M5. Vpulse node becomes a high impedance node and M5 is forced into linear region, pulling Vpulse to VDD once again, as shown in the timing diagram. In region 4, M2 is already on because NPD_slow is high, M4 also turns on, while M1 turns off. As a result, Vpulse is pulled down, as shown in the timing diagram of FIG. 4B.

Figures 7A, 7B:
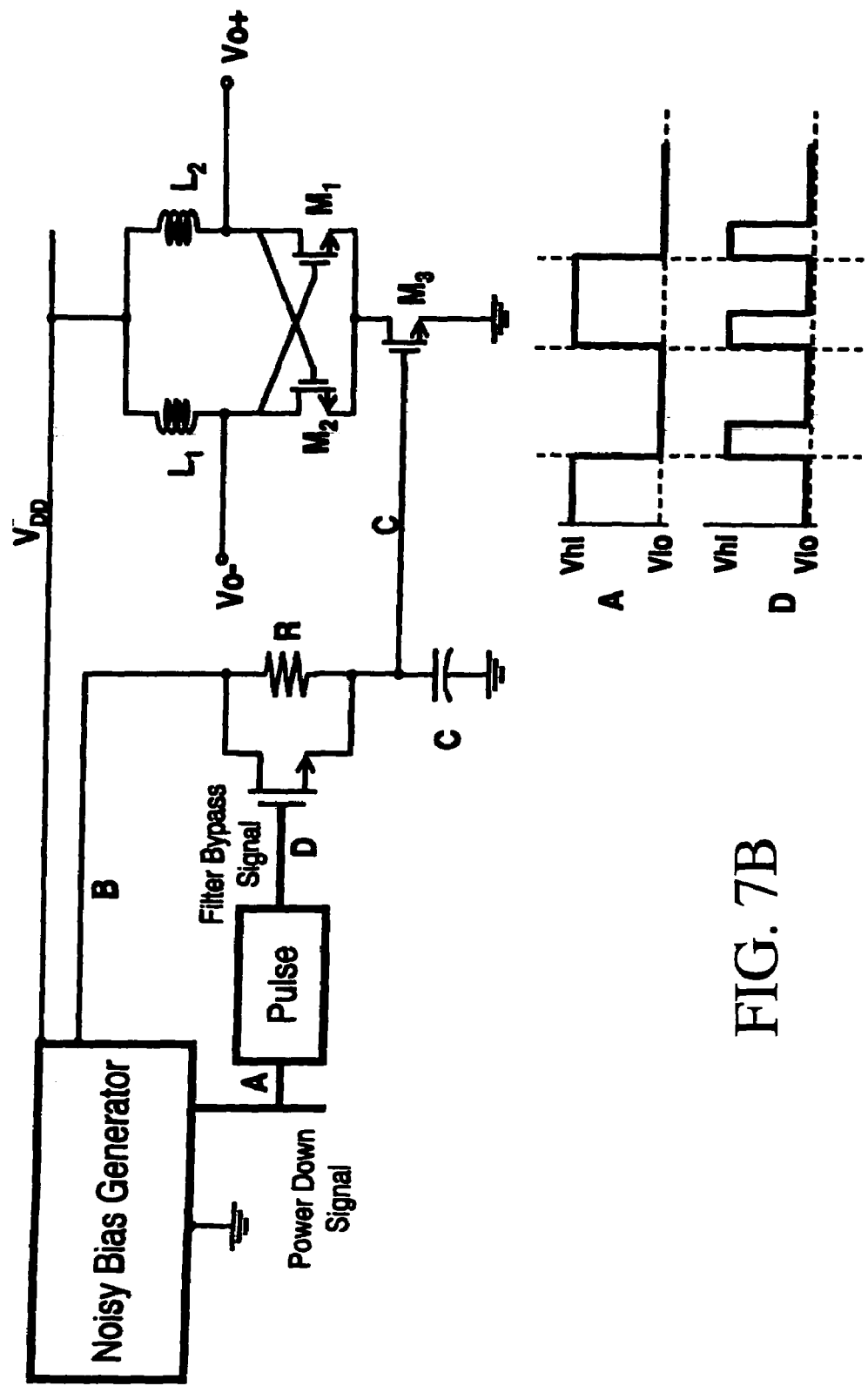
FIG. 7A is an exemplary circuit where a positive control signal needs to be generated on rising and falling edge of a control signal and FIG. 7B is a corresponding timing diagram.

FIG. 7A illustrates a circuit where a positive control signal, such as the filter bypass signal, needs to be generated on rising and falling edge of a control signal, such as the power down signal, according to one embodiment of the invention. As shown a NMOS transistor is used for the switch, because NMOS transistors typically require a high voltage to turn on. FIG. 7B depicts a corresponding timing diagram for the circuit of FIG. 7A.

Figures 8A, 8B:
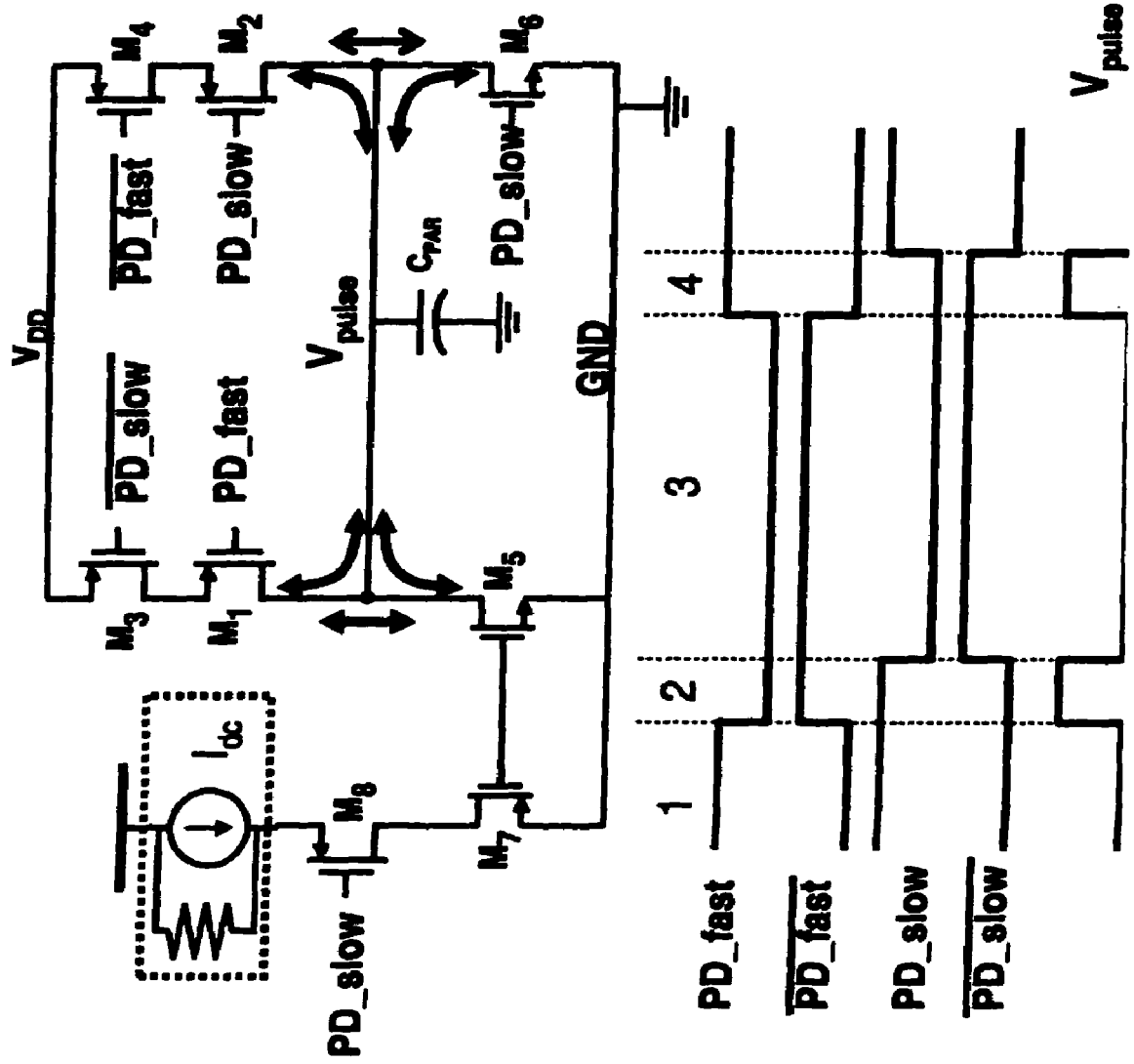
FIG. 8A is an exemplary positive pulse-on-edge circuit that generates an up pulse on each transition of power down signal and FIG. 8B depicts a corresponding timing diagram.

FIG. 8A depicts an exemplary positive pulse-on-edge circuit that generates an up pulse on each transition of the power down (PD) signal. FIG. 8B shows a corresponding timing diagram for the circuit of FIG. 8A. The operation of this circuit is similar to the negative pulse-on-edge circuit of FIG. 6A. As shown in the timing diagram of FIG. 8B, in region 1, PD_slow is high and thus prevents Idc from passing through transistors M8, M7, M5 which are turned off. M3, M4 are on, but M1, M2 are off. M6 is on, pulling Vpulse to VDD.

In region 2, M3 is already turned on by a low NPD_slow, M1 also turns on overcoming M6 and pulling Vpulse to VDD, because M1, M3 are larger than M6. M4 is also turned off by a high NPD_fast. In region 3, M2 is turned on by a low PD_slow, and M4 is already off, because NPD_fast is already high. M3, M6 turn off and M8 turns on, allowing current to reflect through M5. Accordingly, Vpulse node becomes a high impedance node, M5 is forced into linear region, pulling Vpulse to GND once again. In region 4, M2 is already on, M4 turns on, M1 turns off, and Vpulse is pulled up to VDD, as shown in the timing diagram.

In short, different embodiments of the present invention including two complementary circuits that could generate either a positive or negative pulse are described. In one application, these circuits are used to shunt out a filter using either NMOS or PMOS switches. However, these circuits could be used in any situation where a temporary change in state is needed but the only controlling signal contains a semi-permanent state change (one edge) from hi to low or low to high logic levels.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed.

What is claimed is:

1. A method for bypassing a filter, the method comprising:
   generating an inverted control signal, a delayed control signal and an inverted delayed control signal from a control signal;
   generating a pulse signal from the control signal, the inverted control signal, the delayed control signal and the inverted delayed control signal; and
   controlling a switch across the filter by the generated pulse signal to bypass the filter.

2. The method of claim 1 wherein the delayed control signal is generated by inputting the control signal to a series of coupled inverters.

3. The method of claim 1 wherein the control signal is a power down signal.

4. The method of claim 1 wherein the switch is a PMOS transistor.

* * * * *